United States Patent
Tsai et al.

(10) Patent No.: US 7,626,245 B2
(45) Date of Patent: Dec. 1, 2009

(54) EXTREME LOW-K DIELECTRIC FILM SCHEME FOR ADVANCED INTERCONNECT

(75) Inventors: Fang-Wen Tsai, Hsinchu (TW); Kuan-Chen Wang, Hsinchu (TW); Keng-Chu Lin, Pingtung County (TW); Chih-Lung Lin, Taipei (TW); Shwang-Ming Jeng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 213 days.

(21) Appl. No.: 11/968,324

(22) Filed: Jan. 2, 2008

(65) Prior Publication Data

US 2009/0166817 A1   Jul. 2, 2009

(51) Int. Cl.
*H01L 23/58* (2006.01)
*H01L 23/48* (2006.01)
*H01L 29/40* (2006.01)

(52) U.S. Cl. ............... 257/642; 257/758; 257/E21.151

(58) Field of Classification Search ................ 257/432, 257/642, 758, E21.151, E23.001, E31.127
See application file for complete search history.

(56) References Cited

U.S. PATENT DOCUMENTS

| 6,548,892 | B1 * | 4/2003 | Steiner et al. ............... 257/701 |
| 6,875,694 | B1 * | 4/2005 | Ngo et al. ................... 438/687 |
| 7,456,490 | B2 * | 11/2008 | Kloster et al. ............... 257/642 |
| 7,588,995 | B2 * | 9/2009 | Yu et al. ..................... 438/409 |
| 2006/0226548 | A1 * | 10/2006 | Mandal ...................... 257/759 |
| 2006/0240652 | A1 * | 10/2006 | Mandal ...................... 438/562 |

* cited by examiner

*Primary Examiner*—David S Blum
(74) *Attorney, Agent, or Firm*—Thomas, Kayden, Horstemeyer & Risley

(57) ABSTRACT

An extreme low-k (ELK) dielectric film scheme for advanced interconnects includes an upper ELK dielectric layer and a lower ELK dielectric with different refractive indexes. The refractive index of the upper ELK dielectric layer is greater than the refractive index of the lower ELK dielectric layer.

20 Claims, 2 Drawing Sheets

EXTREME LOW-K DIELECTRIC FILM SCHEME FOR ADVANCED INTERCONNECT

TECHNICAL FIELD

The present invention relates to the formation of dielectric layers during fabrication of integrated circuits on semiconductor wafers, and particularly to the formation of extreme low-k dielectric films for advanced interconnects.

BACKGROUND

As the density of semiconductor devices increases, however, the resistance capacitance (RC) delay time increasingly dominates the circuit performance. To reduce the RC delay, there is a desire to switch from conventional dielectrics to low-k dielectrics, which have a dielectric constant less than $SiO_2$ or about 4 to prevent cross-talk between the different levels of metalization and to reduce device power consumption. Low-k dielectrics may also include a class of low-k dielectrics frequently called extreme low-k (ELK) dielectrics, which have a dielectric constant less than about 2.5. One of current ELK materials is a porous low-k material, which is particularly useful as inter-metal dielectrics (IMDs) and as interlayer dielectrics (ILDs) for sub-micron technology, or even for 65 nm node or 45 nm node or beyond technology. The porous low-k dielectric materials produced by spin-on and chemical vapor deposition processes or by a self-assembly process typically require a curing process subsequent to the deposition. Instead of thermally curing or plasma treating, the porous low-k dielectrics can be UV cured at substantially shorter times or at lower temperatures to eliminate the need for prior furnace curing and therefore reducing the total thermal budget, while maintaining or reducing the dielectric constant. However, during the UV curing process, the porous low-k dielectric layer (i.e., a porogen doped SiCO film) only absorbs about 40% UV light, while 60% UV light passes through underlying layers. This causes a decrease in UV curing efficiency that needs longer cure time and lower WPH. The UV penetration issue also degrades the film adhesion of the under layers (i.e., the adhesion between an etch-stop layer and a copper interconnect) that may requires an additional curing process on the cured ELK dielectric layer and front-end of the line (FEOL) devices.

There is therefore a need in the integrated circuit manufacturing art to develop a manufacturing process whereby porous low-k dielectric layers may be formed to improve UV curing efficiency and eliminate the UV penetration issue.

SUMMARY OF THE INVENTION

Embodiments of the present invention include an extreme low-k dielectric film applied to inter-metal dielectric layers for advanced interconnects. The extreme low-k dielectric film includes dual layers with different refractive indexes measured at the same UV light wavelength for prevent a UV light penetrating to under layers during a subsequent UV curing process, enhancing UV curing efficiency and saving UV light.

In one aspect, the present invention provides a semiconductor device including a first extreme low-k (ELK) dielectric layer formed over a semiconductor substrate, and a second ELK dielectric layer formed between the semiconductor substrate and the first ELK dielectric layer. The first ELK dielectric layer has a first refractive index for a UV light at a predetermined wavelength. The second ELK dielectric layer has a second refractive index for a UV light at the predetermined wavelength. The first refractive index is greater than the second refractive index.

In another aspect, the present invention provides a semiconductor device including a semiconductor substrate with a conductive region formed therein, an etch stop layer formed on the semiconductor substrate, a first ELK dielectric layer formed over the etch stop layer, a second ELK dielectric layer formed between the etch stop layer and the first ELK dielectric layer, and a dual damascene structure formed in the ELK dielectric layers and electrically connected with the conductive region. The first ELK dielectric layer has a first refractive index for a UV light at a predetermined wavelength. The second ELK dielectric layer has a second refractive index for a UV light at the predetermined wavelength. The first refractive index is greater than the second refractive index.

In another aspect, the present invention provides a semiconductor device including a semiconductor substrate with a conductive region formed therein, an etch stop layer formed on the semiconductor substrate, an ELK dielectric layer formed over the etch stop layer, an air gap formed between the etch stop layer and the ELK dielectric layer, and a dual damascene structure formed in the ELK dielectric layer and the air gap to be electrically connected with the conductive region. The ELK dielectric layer has a refractive index greater than 1.0.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
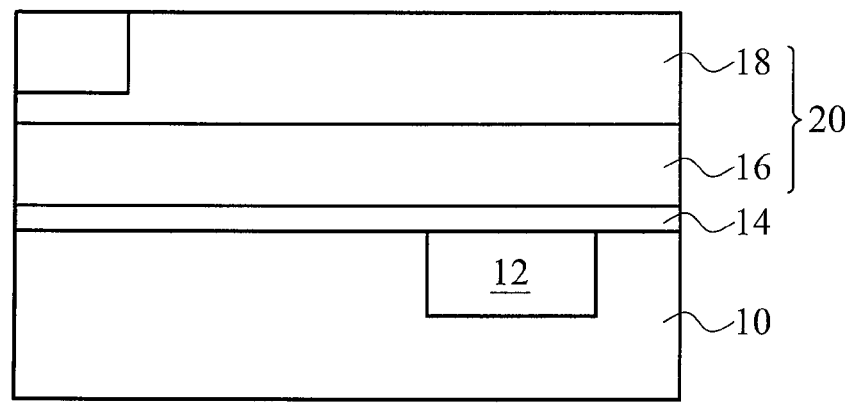
FIGS. 1~3 are cross-sectional views of a portion of a multi-level semiconductor device at stages in an integrated circuit manufacturing process.

Preferred embodiments of the present invention provide a novel scheme of extreme low-k dielectric (ELK) films used as IMD layers or ILD layers in back-end of the line (BEOL) interconnects or front-end of the line (FEOL) interconnects for sub-micron technology (i.e., 65 nm and 45 nm and 32 nm node or beyond technology). As used throughout this disclosure, the term "extreme low-k (ELK)" means a dielectric constant of 2.5 or less, including the term "porous low-k" referring to a dielectric constant of a dielectric material of 2.0 or less. The ELK dielectric films are advantageously used with silicon oxide based low-k dielectric materials having an interconnecting porous structure and a dielectric constant of less than about 2.5.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2:
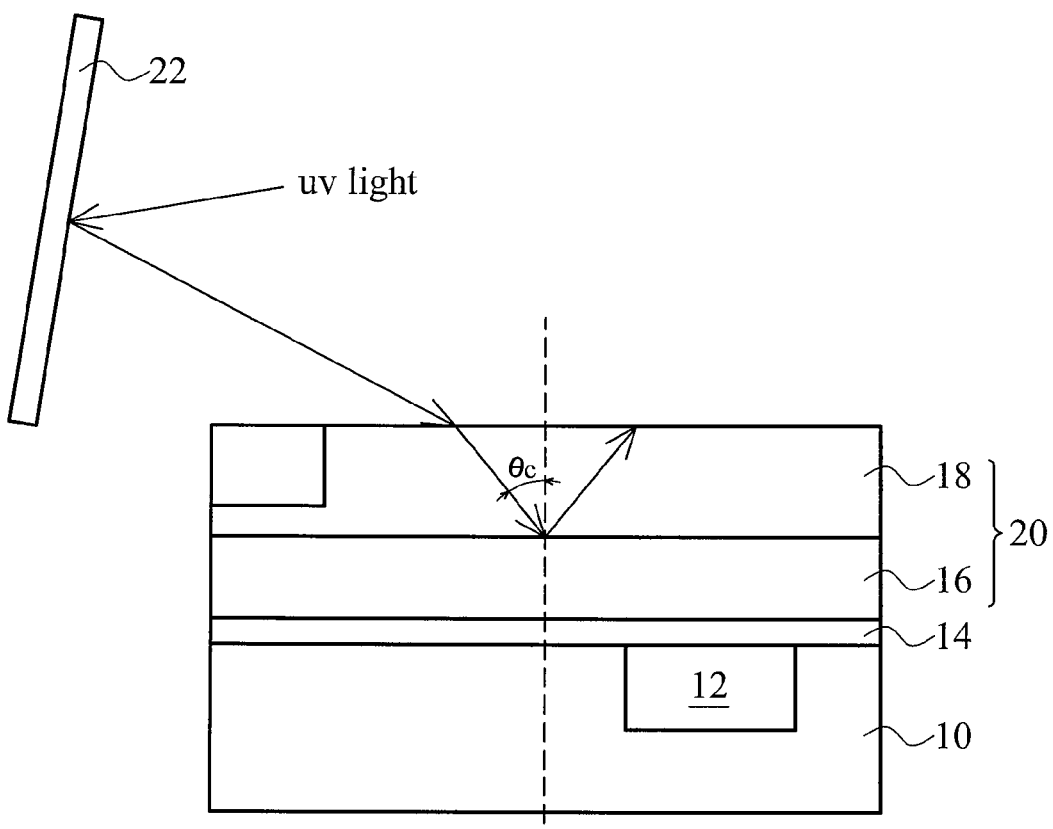
Figure 3:
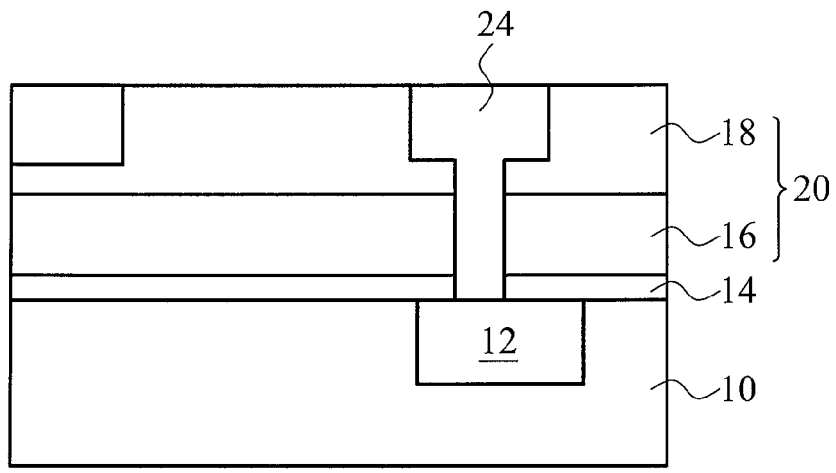

In an exemplary embodiment, FIGS. 1~3 show cross-sectional views of a portion of a multi-level semiconductor device at stages in an integrated circuit manufacturing process.

Referring to FIG. 1, a conductive region 12 is formed in a semiconductor substrate 10 by conventional processes known in the micro-electronic integrated circuit manufacturing art followed by deposition of an etching stop layer 14 overlying the semiconductor substrate 10. Then, an ELK dielectric film scheme 20 including an upper ELK dielectric film 18 and a lower ELK dielectric film 16 with different refractive indexes is deposited on the etch stop layer 14. The refractive index is a constant for a given transparent material. Different wavelengths are refracted different amounts in a given material so it usually has different values for different wavelengths of light. The term "different refractive indexes" is meant two refractive indexes measured for a UV light at a predetermined wavelength.

The semiconductor substrate 10 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. The conductive region 12 is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device. The etch stop layer 14 for controlling the end point during subsequent etching processes is deposited on the above-described semiconductor substrate 10. For example, the etch stop layer 24 is silicon nitride (e.g., SiN, $Si_3N_4$) or silicon carbide (e.g., SiC) formed by a conventional CVD, LPCVD, PECVD, or HDP-CVD process.

The upper ELK dielectric film 18 is preferably formed with an index of refraction ($n_1$) greater than an index of refraction ($n_2$) of the lower ELK dielectric film 16. In an embodiment, $n_1$ is a value greater than or equal to 1.35 for a UV light at a wavelength of 600-700 nm, more preferably at a wavelength of about 677 nm. For example, the upper ELK dielectric film 18 is a silicon oxide based low-k material layer having a porous structure, which can be adapted to a porogen-doped SiCO-based film formed by incorporating a pore generating material (a porogen) into a carbon-doped oxide using plasma CVD such as PECVD including RPCVD or thermal CVD. The upper ELK dielectric film 18 is preferably deposited to a thickness of about 50 Angstroms to about 2000 Angstroms, for example, although it may comprise other thicknesses. One skilled in the art will recognize that the preferred thickness range will be a matter of design choice and will likely decrease as device critical dimensions shrink and processing controls improve over time.

The lower ELK dielectric film 16 is preferably formed with an index of refraction ($n_2$) lower than an index of refraction ($n_1$) of the upper ELK dielectric film 18. In an embodiment, $n_2$ is a value between about 1.0 and about 1.35 for a UV light at a wavelength of 600-700 nm, more preferably at a wavelength of about 677 nm. For example, the lower ELK dielectric film 16 with an index of refraction ($n_2$) of 1.0~1.35 is a silicon oxide based low-k material layer having a porous structure, which can be adapted to a SiCO-based film formed by plasma CVD such as PECVD (plasma enhanced CVD) including RPCVD (remote plasma CVD) or thermal CVD. The lower ELK dielectric layer 16 and the upper ELK dielectric layer 18 may be deposited in-situ or ex-situ. In another embodiment, the lower ELK dielectric film 16 with an index of refraction ($n_2$) of about 1.0 is an air gap formed by thermal decomposition, for example depositing thermally degradable polymer as a sacrificial material and performing a UV curing after a post CMP stage on a completed interconnect structure embedded in the scheme 20. Thus, the lower ELK dielectric layer 16 and the upper ELK dielectric layer 18 are formed ex-situ. The lower ELK dielectric film 16 is preferably deposited to a thickness of about 30 Angstroms to about 2500 Angstroms, for example, although it may comprise other thicknesses. One skilled in the art will recognize that the preferred thickness range will be a matter of design choice and will likely decrease as device critical dimensions shrink and processing controls improve over time.

As the ELK dielectric film scheme 20 including the dual ELK dielectric layers 16 and 18 with different refractive indexes $n_1$ and $n_2$ is completed, a UV curing process is performed in a chamber. Referring to FIG. 2, an exemplary reflector 22 is provided in the chamber so that the emitted UV light is appropriately reflected and angles of the reflector 20 are adjustable so as to be able to uniform the illumination. The direction of the refraction for the UV light passing through the upper ELK dielectric film 18 is primarily determined by Snell's law. Snell's law holds that $n_1 \sin \theta_1 = n_2 \sin \theta_2$, wherein $n_1$ is the refractive index of the upper ELK dielectric film 18, $n_2$ is the refractive index of the lower ELK dielectric film 16, $\theta_1$ is the angle that the UV light in the upper ELK dielectric film 18 makes at the refractive interface with respect to a normal reference line, $\theta_2$ is the angle that the UV light in the lower ELK dielectric film 16 makes at the refractive interface with respect to the normal reference line. If the angle of incidence (i.e. $\theta_1$) is greater than or equal to a critical angle (i.e. $\theta_C$), then the UV light undergoes total internal reflection within the upper ELK dielectric film 18. Total internal reflection occurs in accordance with $\theta_c = \sin^{-1}(n_2/n_1)$ for $n_1 > n_2$. Thus, in the embodiment, when the reflector 22 is adjusted to make $\theta_1$ greater than or equal to $\theta_C$, the UV light does not enter the lower ELK dielectric film 16, but is reflected internally in the upper ELK dielectric film 18. Experimentally, compared with the conventional single ELK dielectric film scheme, the dual ELK dielectric scheme with dual refractive indexes of the invention can prevent the UV light penetrating into under layers so as to save about 60% UV light, which advantageously improves UV curing efficiency.

An exemplary dual damascene structure 24 formed in the ELK dielectric film scheme 20 is shown in FIG. 3. One or more hardmask/bottom anti-reflectance coating (BARC) layers may be provided over the ELK dielectric film scheme 20 at an appropriate thickness, to minimize light reflectance in a subsequent photolithographic patterning process. Lithographic and etching processes are then carried to form a dual damascene opening including for example an upper via opening and a lower trench opening. A barrier layer, preferably including one of a refractory metal, refractory metal nitride, and silicided refractory metal nitride layer, for example Ta, Ti, W, TaN, TiN, WN, TaSiN, TiSiN, and WSiN is deposited to line the dual damascene opening. For filling the dual damascene opening, copper deposition processes, for example electrochemical deposition preceded by deposition of a copper seed layer is carried out, and then a copper ECD process is performed followed by a CMP process to remove the excess portion of copper layer, barrier layer, and at least a portion of hardmask/BARC layer to complete the formation of the dual damascene structure 24.

Figure 4:
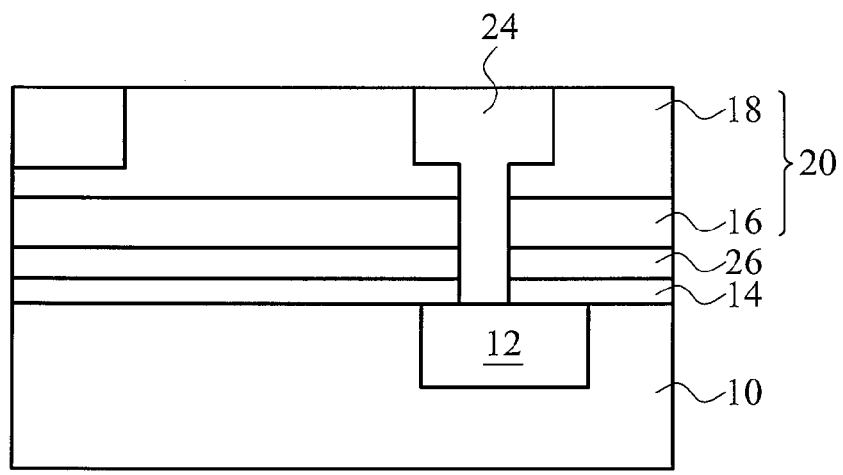
FIG. 4 is a cross-sectional diagram illustrating an exemplary embodiment of an extreme ELK dielectric film for advanced interconnects.

Although the present invention is explained by reference to an exemplary ELK dielectric film scheme 20 on the etch stop layer 14 with a refractive index of about 2.0, it will be appreciated that the ELK dielectric film scheme 20 of the present invention applies generally to a dielectric layer with a refractive index $n_3$ greater than $n_2$ of the lower ELK dielectric layer 16. FIG. 4 shows another embodiment providing the ELK dielectric film scheme 20 on a TEOS oxide layer 26 for an integrated circuit manufacturing process. The TEOS oxide layer 25 has a refractive index of about 1.46.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A semiconductor device, comprising:
   a semiconductor substrate;
   a first dielectric layer with a dielectric constant not greater than 2.5 formed over said semiconductor substrate; and
   a second dielectric layer with a dielectric constant not greater than 2.5 formed between said semiconductor substrate and said first dielectric layer;
   wherein said first dielectric layer has a first refractive index for a UV light at a predetermined wavelength, said second dielectric layer has a second refractive index for a UV light at said predetermined wavelength, and said first refractive index is greater than said second refractive index.

2. The semiconductor device of claim 1, wherein said first refractive index is greater than or equal to about 1.35 for a UV light at a wavelength of 600~700 nm.

3. The semiconductor device of claim 1, wherein said second refractive index is in the range from about 1.0 to about 1.35 for a UV light at a wavelength of 600~700 nm.

4. The semiconductor device of claim 1, wherein said first dielectric layer is a porous SiCO-based dielectric layer.

5. The semiconductor device of claim 1, wherein said second dielectric layer is a porous SiCO-based dielectric layer.

6. The semiconductor device of claim 1, further comprising a damascene structure in said first dielectric layer and said second dielectric layer, electrically connecting with a conductive region formed in said semiconductor substrate.

7. The semiconductor device of claim 1, further comprising an etch stop layer between said second dielectric layer and said semiconductor substrate.

8. The semiconductor device of claim 7, further comprising a TEOS oxide layer between said second dielectric layer and said etch stop layer.

9. The semiconductor device of claim 1, wherein said first dielectric layer has a thickness of about 50 Angstroms to about 2000 Angstroms.

10. The semiconductor device of claim 1, wherein said second dielectric layer has a thickness of about 30 Angstroms to about 2500 Angstroms.

11. A semiconductor device, comprising:
    a semiconductor substrate comprising a conductive region formed therein;
    an etch stop layer formed on said semiconductor substrate;
    a first dielectric layer with a dielectric constant not greater than 2.5 formed over said etch stop layer;
    a second dielectric layer with a dielectric constant not greater than 2.5 formed between said etch stop layer and said first dielectric layer; and
    a dual damascene structure formed in said first dielectric layer and said second dielectric layer, electrically connected with said conductive region of said semiconductor substrate;
    wherein said first dielectric layer has a first refractive index for a UV light at a predetermined wavelength, said second dielectric layer has a second refractive index for a UV light at said predetermined wavelength, and said first refractive index is greater than said second refractive index.

12. The semiconductor device of claim 11, wherein said first dielectric layer is a porous SiCO-based dielectric layer with a refractive index greater than or equal to about 1.35 for a UV light at a wavelength of 600~700 nm.

13. The semiconductor device of claim 11, wherein said second dielectric layer is a porous SiCO-based dielectric layer with a refractive index in the range from about 1.0 to about 1.35 for a UV light at a wavelength of 600~700 nm.

14. The semiconductor device of claim 11, further comprising a TEOS oxide layer between said second dielectric layer and said etch stop layer.

15. The semiconductor device of claim 11, wherein said first dielectric layer has a thickness of about 50 Angstroms to about 2000 Angstroms.

16. The semiconductor device of claim 11, wherein said second dielectric layer has a thickness of about 30 Angstroms to about 2500 Angstroms.

17. A semiconductor device, comprising:
    a semiconductor substrate comprising a conductive region formed therein;
    an etch stop layer formed on said semiconductor substrate;
    a dielectric layer with a dielectric constant not greater than 2.5 formed over said etch stop layer;
    an air gap formed between said etch stop layer and said dielectric layer; and
    a dual damascene structure formed in said dielectric layer and said air gap, electrically connected with said conductive region of said semiconductor substrate;
    wherein said dielectric layer has a refractive index greater than 1.0.

18. The semiconductor device of claim 17, wherein said first dielectric layer is a porous SiCO-based dielectric layer with a refractive index greater than or equal to about 1.35 for a UV light at a wavelength of 600~700 nm.

19. The semiconductor device of claim 17, further comprising a TEOS oxide layer between said air gap and said etch stop layer.

20. The semiconductor device of claim 17, wherein said dielectric layer has a thickness of about 50 Angstroms to about 2000 Angstroms.

* * * * *